United States Patent [19]
Ipri et al.

[11] 4,442,447
[45] Apr. 10, 1984

[54] ELECTRICALLY ALTERABLE NONVOLATILE FLOATING GATE MEMORY DEVICE

[75] Inventors: Alfred C. Ipri, Princeton; Roger G. Stewart, Neshanic Station, both of N.J.

[73] Assignee: RCA Corporation, New York, N.Y.

[21] Appl. No.: 472,636

[22] Filed: Mar. 7, 1983

[30] Foreign Application Priority Data

Mar. 9, 1982 [GB] United Kingdom ................ 8206906

[51] Int. Cl.³ .................... H01L 27/02; H01L 29/78; G11C 11/40
[52] U.S. Cl. ...................................... 357/41; 357/23; 365/185
[58] Field of Search ............ 357/23 VT, 41; 365/185

[56] References Cited

U.S. PATENT DOCUMENTS

| | | | |
|---|---|---|---|
| 3,500,142 | 3/1970 | Kahng | 317/235 |
| 4,019,197 | 4/1977 | Lohstroh et al. | 357/23 VT |
| 4,115,914 | 9/1978 | Harari | 357/23 VT |
| 4,122,544 | 10/1978 | McElroy | 357/23 VT |
| 4,251,829 | 2/1981 | Adam | 357/23 VT |
| 4,328,565 | 5/1982 | Harari | 365/185 |
| 4,375,087 | 2/1983 | Wanlass | 357/23 VT |

OTHER PUBLICATIONS

"16-K EE-PROM Relies on Tunneling for Byte—Eraseable Program Storage" W. S. Johnson et al., Electronics, Feb. 28, 1980, pp. 113–117.

Primary Examiner—Gene M. Munson
Attorney, Agent, or Firm—Birgit E. Morris; Donald S. Cohen; Lawrence P. Benjamin

[57] ABSTRACT

An electrically alterable, nonvolatile floating gate memory device is described having enhanced write efficiency by reason of an extension of the floating gate member. The extension is made to extend over the drain line of an adjacent memory device and serves to provide the floating gate member with additional capacitance during the write operation thereby permitting a higher write efficiency for a given voltage.

6 Claims, 4 Drawing Figures

ELECTRICALLY ALTERABLE NONVOLATILE FLOATING GATE MEMORY DEVICE

BACKGROUND OF THE INVENTION

This invention relates, in general, to semiconductor memory devices and more particularly, to electrically alterable, nonvolatile floating gate memory devices.

The microprocessor based systems, as well as the related arts, have long required electrically alterable read only memory (EAROM) elements that were nonvolatile and many such devices have, to some extent, filled this need. However, as the computer arts have become more complex in nature and have required high speeds and greater capacity there now exists the need for a high density memory device that may be easily programmed or "written" and, as the occasion arises, to reprogram ("erase" and "rewrite") the device in the field. To this end, devices are presently available to the design engineers that exhibit nonvolatile characteristics but, as will be discussed, they have inherent shortcomings that are overcome by the subject invention.

One such device resides in the family of Floating Gate Avalanche Metal Oxide Semiconductor (FAMOS) devices. The advantage of this type of device resides in the fact that it is independent of any outside current to maintain the stored information in the event power is lost or interrupted. Since these devices are independent of any outside power there is also no need to refresh the device which feature results in a significant savings in power.

The floating gate family of devices usually has source and drain regions of a given conductivity type, formed in a substrate of the opposite conductivity type, at the surface thereof. Between the source and drain regions, and on the surface of the substrate, a gate structure is formed by first applying a thin insulating layer followed by a conductive layer (the floating gate) followed by a second insulating layer in order to completely surround the floating gate and insulate it from the remainder of the device. A second conductive layer (usually referred to as the control gate) is formed over the second insulating layer (in the region of the floating gate) to complete the gate structure. One example of such a device is exemplified in U.S. Pat. No. 3,500,142 which issued to D. Kahng on Mar. 10, 1970.

The major drawback of this prior art device resides in the fact that high fields are required to produce the necessary avalanche breakdown in order for charge to be placed on the floating gate. Further, to erase charge placed on the floating gate, the entire device must be provided with a transparent window so that the chip may be flooded with energy in the ultra violet or x-ray portion of the spectrum. Thus, it is extremely difficult to erase a single "word" without erasing all the charge on the device then requiring that the entire chip be completely reprogrammed. Further, the erasing step required an extremely long period of exposure time, of the order of about 30 to 45 minutes, with the device or chip removed from the equipment.

In the recent years, the art has progressed to the point where nonvolatile, floating gate read only memory devices have been produced which are electrically alterable. One such memory cell has been described in detail in an article entitled "16K -EE²PROM Relies on Tunneling for Byte-Erasable Program Storage" by W. S. Johnson, et al., ELECTRONICS, Feb. 28, 1980, pp. 113-117. In this article the authors describe a "Floating-Gate Tunnel Oxide" structure wherein a cell using a polycrystalline silicon (polysilicon) floating gate structure has its gate member charged with electrons (or holes) through thin oxide layer positioned between the floating gate and the substrate by means of the Fowler-Nordheim tunneling mechanism. An elevation view of a typical device is described, and shown in FIG. 1 of the article, wherein the floating gate member represents the first polysilicon level. By using this type of structure (a structure wherein the first level polysilicon represents the floating gate since it is closest to the substrate, and is covered by a second polysilicon level) an excessively high floating gate-to-substrate capacitance is produced. However, acceptably low "write" and "erase" operations can only be achieved when most of the applied voltage appears across the tunnel region which requires that the floating gate-to-control gate (second polysilicon level) capacitance be larger than the floating gate-to-substrate capacitance. Further, to achieve the required distribution of capacitance to produce the acceptable "write" and "erase" characteristics, the prior art has resorted to extending both the first and second polysilicon levels over the adjacent field oxide to obtain the additional capacitance. The net result is an undesirably large cell wherein large areas of field oxide must be utilized to achieve the necessary capacitance.

In a recent application, filed in the U.S. Patent and Trademark Office by the same applicants on Feb. 18, 1983 Ser. No. 467,463 entitled "AN ELECTRICALLY ALTERABLE, NONVOLATILE FLOATING GATE MEMORY DEVICE", and assigned to the same assignee as the subject application, we described a novel configuration of floating gate memory device wherein:

$$C_2 < C_3 > C_1 \text{ and} \quad (1)$$

$$C_3 = xC_2 = yC_1 \quad (1a)$$

where:

$C_1$ = The floating gate-to-substrate capacitance;

$C_2$ = The first conductive layer-to-floating gate capacitance; and $C_3$ = The second conductive layer-to-floating gate capacitance.

$X > 1$ and $Y > 1$.

In the example given when, for example, both x and y=3 then equation (1) may be rewritten as $C_3 = 3C_2 = 3C_1$. In accordance with the teachings therein, the write efficiency may, for practical purposes, be raised to about 80%. This is done by tailoring the various capacitances in order to effectively alter the capacitance distribution ratio for both the read operation and the write/erase operations. Further, when both poly layers are driven together (the same voltage of the same polarity applied thereto), the induced voltage across the layer of tunnel oxide is reduced to about 20% of the applied voltage during the read operation.

The results sought in our prior application were achieved by tailoring the shape of the floating gate memory so that, at its narrowest portion, it is aligned with the channel region and also extends outwardly over the field oxide which is adjacent to and defines the channel region. Further, by tailoring the length (the shorter dimension) of both the program line and the word line, the overlap of the word line over the program line, as well as the thicknesses of the oxide therebetween, we are able to achieve the efficiencies sought.

Accordingly, this corresponding application is incorporated herein in its entirety.

SUMMARY OF THE INVENTION

We have found that we can achieve enhanced write efficiency by using additional capacitive coupling to the floating gate. This is accomplished by extending the floating gate over the drain line of an adjacent cell which is appropriately biased to a high voltage during the write operation. The increased capacitance thus permits higher write efficiency for a given write voltage, than possible with the prior art.

DETAILED DESCRIPTION OF THE PREFERRED EMBODIMENT

In the following drawings, illustration of the insulation layers existing between the floating gate and the substrate and between the control gate and floating gate, and so on, has been omitted for the sake of simplicity.

Figure 1:
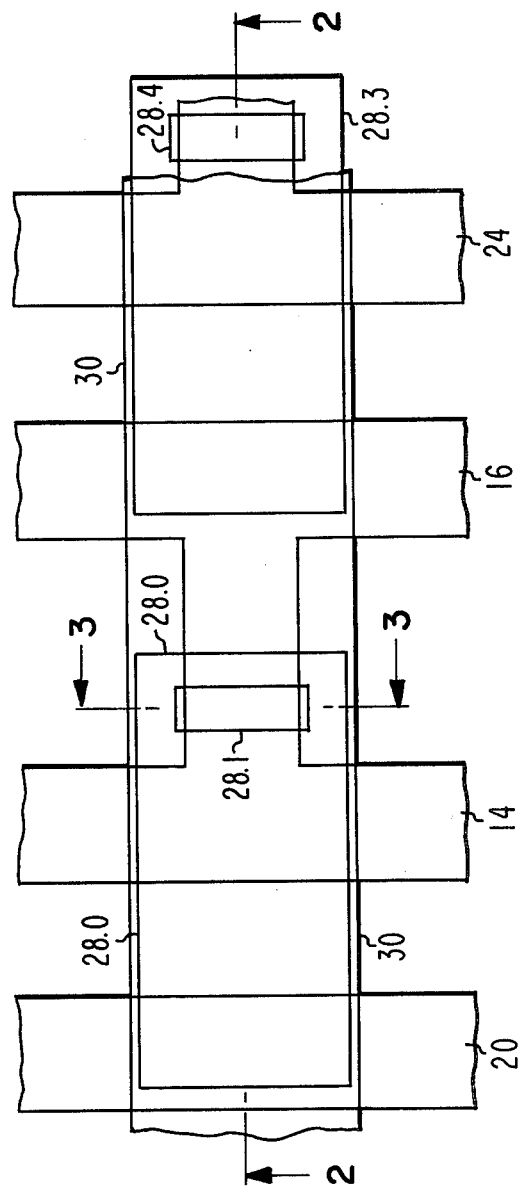
FIG. 1 is a plan view of an electrically alterable, nonvolatile floating gate memory device made in accordance with the teachings of our invention.
Figure 2:
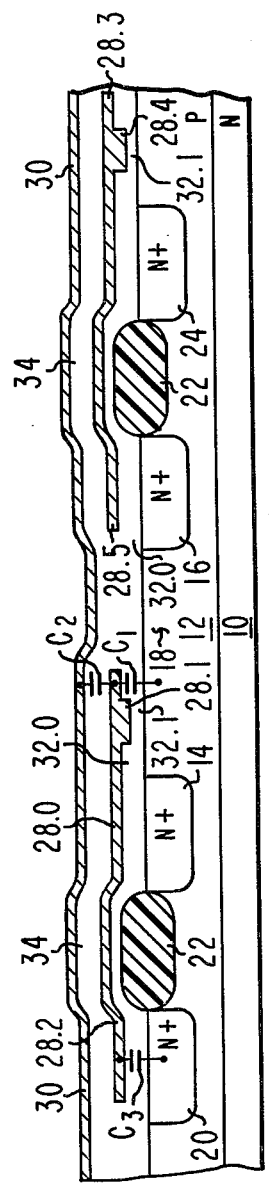
FIG. 2 is a cross-sectional, elevation view of our novel memory device taken along line 2—2 of FIG. 1.
Figure 3:
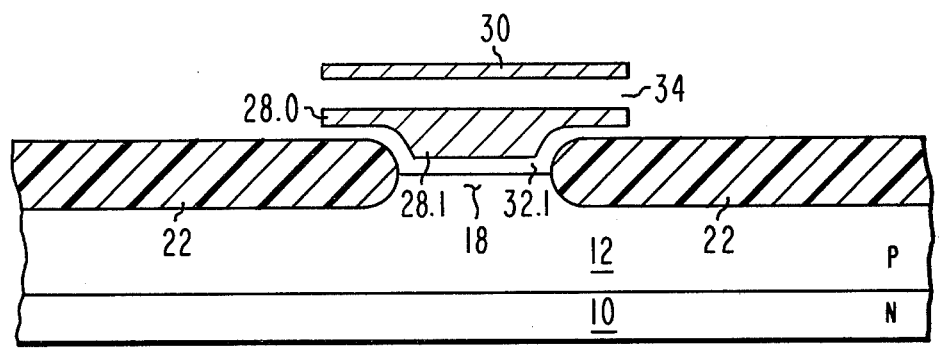
FIG. 3 is a cross-sectional view of our novel memory device taken along line 3—3 of FIG. 1.

Referring now to FIGS. 1, 2 and 3, there is shown a P well 12 formed in an N type substrate 10 with P well 12 having N type doped source and drain lines 14 and 16 respectively, formed therein and separated by channel region 18. At the surface of P well 12 are field oxide regions 22 which define the limits of the active regions consisting of source line 14, drain line 16, and channel region 18. Above channel region 18, extending partially thereover and in a direction generally parallel thereto, is the floating gate member 28.0. A conductive floating gate member 28.0 is provided with a write/erase window section formed therein consisting of a portion 28.1 formed over channel region 18 and which may be thicker than gate member 28.0. Floating gate member 28.0 is separated and insulated from the surface of P well 12 by means of insulator layer 32.0 which, typically, may have a thickness of about 500 angstroms and has a capacitance herein designated as $C_1$. Window section 28.1 is separated and insulated from the channel region 18 by insulator layer 32.1 which, typically, may have a thickness of about 100 angstroms.

A conductive control gate member 30 is positioned above and generally parallel to floating gate member 28.0 and has a narrow dimension (its length) aligned with floating gate member 28.0. Control gate 30 is insulated from floating gate member 28.0 by means of insulating layer 34 which may have a thickness of about 500 angstroms and has a capacitance herein designated as $C_2$. It should be noted that the floating gate member 28.0, for the cell consisting of source and drain regions 14 and 16 together with channel region 18, has a coupling portion 28.2 that extends over the field oxide 22 and over a portion of the drain 20 of the next adjacent cell (here shown at the left) and has a capacitance herein designated as $C_3$. Similarly, the floating gate member for the next adjacent cell to the right (28.3) has a coupling portion 28.5 that extends over the separating field oxide 22 and is coupled to drain region 16. Floating gate member 28.3 has a write/erase window 28.4 insulated from P well 12 by 100 angstroms of insulator layer 32.1 while the remainder of floating gate member 28.3 is insulated from P well 12 by insulator layer 32.0 having a thickness of about 500 angstroms.

The basic problem addressed in the subject application is to improve the write efficiency of an electrically alterable nonvolatile floating gate memory device and we have chosen to solve this problem by maximizing the electric field appearing across tunnel oxide 32.1 ($C_1$). This was achieved in the prior art by maximizing the capacitance between the control gate and the floating gate and by minimizing the capacitance between the floating gate and substrate. In the subject application the electric field across the tunnel oxide is instead enhanced by coupling the floating gate to a deselected source or drain (bit) line, in an adjacent cell, having an "inhibit" signal applied thereto. While the foregoing explanation will be presented in terms of coupling to an adjacent deselected drain line, it should be obvious to those skilled in the art that this may also be a source line.

Since the deselected drain line will be at the same potential as the control gate during the write operation, an additional write voltage is thus effectively coupled to the floating gate through capacitor $C_3$ (FIG. 2). Thus, $C_2$ and $C_3$ (FIG. 2) are effectively in parallel and the effective capacitance will be equal to the sum of $C_2$ and $C_3$. Accordingly, the write efficiency, without the additional coupling of $C_3$, may be written as:

$$\text{write eff.} = \frac{C_2}{C_1 + C_2} \quad (2)$$

where:

$C_1$ = Floating gate-to-substrate capacitance;
$C_2$ = Control gate-to-floating gate capacitance; and
$C_3$ = Floating gate-to-adjacent high voltage line.

Since $C_3$ is effectively in parallel with $C_1$ the effective write efficiency may now be expressed as:

$$\text{write eff.} = \frac{C_2 + C_3}{C_1 + C_2 + C_3} \quad (3)$$

This can be shown to be greater than the write efficiency without $C_3$ since:

$$\lim_{C_3 \to 0} \frac{C_2 + C_3}{C_1 + C_2 + C_3} = \frac{C_2}{C_1 + C_2} \quad (4)$$

While:

$$\lim_{C_3 \to \infty} \frac{C_2 + C_3}{C_1 + C_2 + C_3} = 1 \quad (5)$$

Therefore, the write efficiency of the subject application will range between the value given by equation (4) and 1, as shown in equation (5), as $C_3$ ranges between 0 and infinity. Accordingly, the greater the capacitance of $C_3$ the more nearly the write efficiency approaches 100%.

The following table shows the nominal potentials applied to the various elements of our device in order to perform the "read", "write" (write inhibit), "erase" and "erase", (inhibit erase), functions. In the table, the various potentials shown in each of the columns are applied to the elements shown in the columns entitled "ELEMENT."

| ELEMENT | READ | WRITE | $\overline{\text{WORD}}$ WRITE | $\overline{\text{BIT}}$ WRITE | ERASE | $\overline{\text{WORD}}$ ERASE | $\overline{\text{BIT}}$ ERASE |
|---|---|---|---|---|---|---|---|
| Source (14) | 0V | 0V | 0V | 20V | 20V | 20V | 20V |
| Drain (16) | 5V | 0V | 0V | 20V | 20V | 20V | 20V |
| P well (12) | 0V | 0V | 0V | 0V | 20V | 0V | 0V |
| Control gate (30) | 5V | 20V | 0V | 20V | 0V | 0V | 20V |

Thus, as shown in the above table, the device is initially erased by placing a 20 volt signal on drain 16, source 14 and P well 12 while control gate 30 is grounded. This initial "erase" cycle places a positive charge on floating gate 28.0 which puts channel region 18 in a low threshold (high conduction) state. However, there will be no electron flow through channel region 18 unless and until the proper "read" voltages, as indicated in the above table, are applied. This provides a convenient method for checking the device to determine that it is, in fact, erased.

To "write", a 20 volt signal is placed on line 20 and on control gate 30, while source 14, drain 16 and P well 12 are maintained at ground potential (zero volts). This has the effect of placing a negative charge on floating gate 28.0 which puts channel region 18 in a high threshold (low conduction) state due to the parallel connection of $C_2$ and $C_3$ as per equation (5). Under these conditions the negative charge on floating gate 28.0 will prevent channel region 18 from being inverted and no conduction can take place between source 14 and drain 16 during the read cycle. To "read" the device, that is, to determine whether a high or a low threshold state has been written into the given cell, a 5 volt signal is placed on drain 16 and control gate 30 while source 14 and P well 12 are maintained at ground potential. The indication of conduction under these circumstances, will thus signify the presence of a low threshold state (erased) device.

Figure 4:
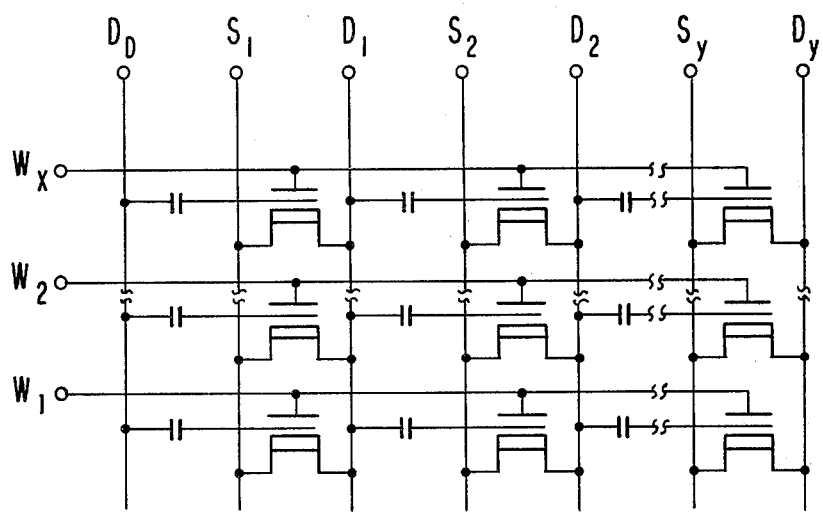
FIG. 4 is a schematic representation of an array of devices of our invention.

While we have described the operation of a single device it should be obvious to those skilled in the art that a plurality of these devices may be assembled in rows and columns to form an array. One such array is illustrated in FIG. 4 where, when read in conjunction with FIGS. 1–3, we show how our novel device may be arranged as an array in a single well. In FIG. 4, the lines labelled $S_1$ and $D_1$ denote the common source and drain lines (14 and 16) and are shared by all the devices in the first column, while $S_2$-$D_2$ through $S_n$-$D_n$ denote the remaining columns and their respective shared sources and drains. $W_1$, $W_2$-$W_x$ designates the control gate 30 in each row. Thus, to form a 1024-bit array, one would form eight columns ($S_1$-$D_1$ through $S_y$-$D_y$) with one hundred twenty-eight devices connected to word lines $W_1$-$W_{128}$. If, for example, one were desirous of assembling a 16 thousand (2K×8) bit array, one would first form 16 P wells each of which would have 8 of these devices in a row and 128 rows high. Thus, each P well would have 1024 of these devices and the array would contain 16,384 cells. Each of the 128 devices in a column in a given P well would share the same source and drain lines such as 14 and 16 of FIGS. 1–3 while each of the devices in the same horizontal row of all wells would share a common control gate such as 30. However, each device would have its own floating gate member 28.0/28.1.

Accordingly, by appropriately biasing the source and drain lines 14 and 16 as well as P wells 12, as shown in the above table, one could very easily "write", or "read" any one of the 16 thousand devices present and "erase" all of the devices in a given row in a given well. To be certain that only the selected cells are erased, a word erase voltage (word erase inhibit) and a bit erase (bit erase inhibit) voltage of 0 volts is applied to the other P wells while about 20 volts is applied to the other sources 14, drains 16 and bit line 20 (which may be the source (bit) line of an adjacent cell). To be certain that only the selected cell is "written" a word write (word write inhibit) and a bit write (bit write inhibit of about 20 volts is applied to the deselected sources and drains as well as bit lines 20 (which may be the source line of an adjacent cell).

While we have chosen to describe our device in terms of multiple layers of polysilicon (polycrystalline silicon), we do not wish to be so limited. It should now be obvious to those skilled in the art that various other conductive layers such as refractory metals, refractory metal silicides etc, or any combinations thereof may be used in place of polysilicon layers 18, 20 and 22.

Further, while we have chosen to show our device structure as a P well in an N substrate, it should be obvious that our device may also be formed in a P substrate resulting in a smaller array.

What we claim is:

1. An array of nonvolatile floating gate memory devices arranged in rows and columns in a body of semiconductor material of a first conductivity type, alternate first and second doped regions of a second conductivity type arranged in columns embedded in the semiconductor body and spaced one from the other to define a channel region therebetween, a plurality of floating gate members in rows insulated from the substrate, each of the plurality of floating gate members defining a row having its one end thereof disposed over a respective channel region to define a first capacitance between the floating gate member and the body of the semiconductor material, the improvement comprising:

a plurality of rows of conductive layers, the layer of each row insulated from and aligned with the floating gate members in a given row to define a second capacitance between the conductive layer and the overlying floating gate member; and an extended floating gate portion affixed to the other end of the floating gate member and extending therefrom over a first doped region associated with the respective channel region of one memory device to an adjacent second doped region of the next adjacent memory device to define a third capacitance between the other end of the floating gate member and to the adjacent doped region whereby, when a first source of potential is applied to the first and second regions and the body of semiconductor material and a second source of potential is applied to the adjacent doped region and a conductive layer, the second and third capacitances are effectively in parallel.

2. The floating gate memory device of claim 1, further comprising:
   a charging window affixed to the floating gate member between the floating gate member and the substrate and insulated from the substrate by a layer of silicon dioxide; and
   the conductive layer is a word line that is insulated from the floating gate member by a layer of silicon oxide.

3. The floating gate memory device of claim 2, wherein:
   the second and first regions are drain and source lines respectively.

4. The floating gate memory array of claim 3, wherein:
   the body of semiconductor material is a well region of the first conductivity type formed in a substrate of the second conductivity type.

5. The floating gate memory array of claim 3 wherein:
   a third region bit line for each device in the first column is a doped line of second conductivity type adjacent and insulated from the first column source line.

6. The floating gate memory array of claim 3, comprising a plurality of well regions;
   a plurality of devices in each of the well regions, each plurality in each well arranged in rows and columns;
   each device in a given row in all of the well regions sharing a common word line; and
   each device in a given column of a given well region sharing a common source region and a common drain region.

* * * * *

UNITED STATES PATENT AND TRADEMARK OFFICE
CERTIFICATE OF CORRECTION

PATENT NO. : 4,442,447

DATED : Apr. 10, 1984

INVENTOR(S): Alfred C. Ipri and Roger G. Stewart

It is certified that error appears in the above-identified patent and that said Letters Patent is hereby corrected as shown below:

In column 2, line 29:

Cancel "No. 467,463" and instead insert --No. 467,643--.

Signed and Sealed this

Third Day of July 1984

[SEAL]

Attest:

Attesting Officer

GERALD J. MOSSINGHOFF

Commissioner of Patents and Trademarks